United States Patent [19]

Takeuchi et al.

[11] Patent Number: 5,291,081
[45] Date of Patent: Mar. 1, 1994

[54] APPARATUS FOR DETECTION OF NON-MODULATED SIGNAL AND FREQUENCY ACQUISITION

[75] Inventors: Yoshio Takeuchi; Hideo Kobayashi, both of Saitama, Japan

[73] Assignee: Kokusai Denshin Denwa Co., Ltd., Tokyo, Japan

[21] Appl. No.: 971,134

[22] Filed: Nov. 4, 1992

[30] Foreign Application Priority Data

Nov. 13, 1991 [JP] Japan ................... 3-323997

[51] Int. Cl.$^5$ .................. H03D 13/00; H03K 9/06
[52] U.S. Cl. ..................... 307/522; 307/271; 328/15; 328/139; 455/192.1
[58] Field of Search .............. 328/14, 15, 139, 138, 328/140; 307/271, 522; 455/192, 258

[56] References Cited

U.S. PATENT DOCUMENTS

| | | | |
|---|---|---|---|
| 3,835,404 | 9/1974 | Nakamura et al. | 328/151 |
| 4,127,819 | 11/1978 | Keane | 334/16 |
| 4,461,014 | 7/1984 | Fujino | 328/155 |
| 4,651,104 | 3/1987 | Miyo | 328/139 |
| 5,077,531 | 12/1991 | Takeuchi et al. | 329/304 |

OTHER PUBLICATIONS

"Preambleless Demodulator for Satellite Communications", Tomita et al, IEEE International Conference on Communications, Bostonicc/89, Jun. 1989, pp. 0504-0508.

Primary Examiner—Timothy P. Callahan
Attorney, Agent, or Firm—Nikaido, Marmelstein, Murray & Oram

[57] ABSTRACT

In radio communication with non-modulated signal at head of receive signal, the non-modulated signal or the head of the receive signal is detected in spite of rather large frequency error of receive signal, and frequency acquisition for coherent detection in a receiver is established during detection operation of the non-modulated signal Discrete Fourier Transform (1) is carried out for an input signal in digital form in every receive sample to provide frequency spectrum of an input signal. Then, the maximum component is selected (2) in the frequency spectrum. Next, a peak detector (3) detects peak value of the selected maximum components on time axis, and recognizes the detection of the non-modulated signal. The frequency ($f_e$) of the non-modulated signal is estimated through interpolation of the selected component having the peak value and the adjacent component. The receive frequency is adjusted by using said estimated frequency ($f_e$), and the adjusted frequency is subject to coherent detection.

9 Claims, 6 Drawing Sheets

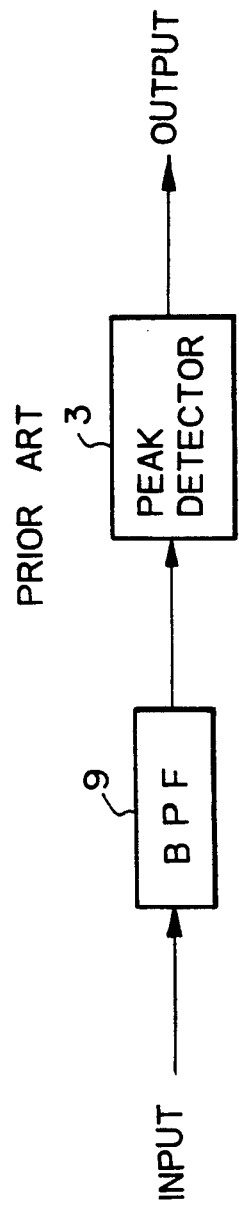
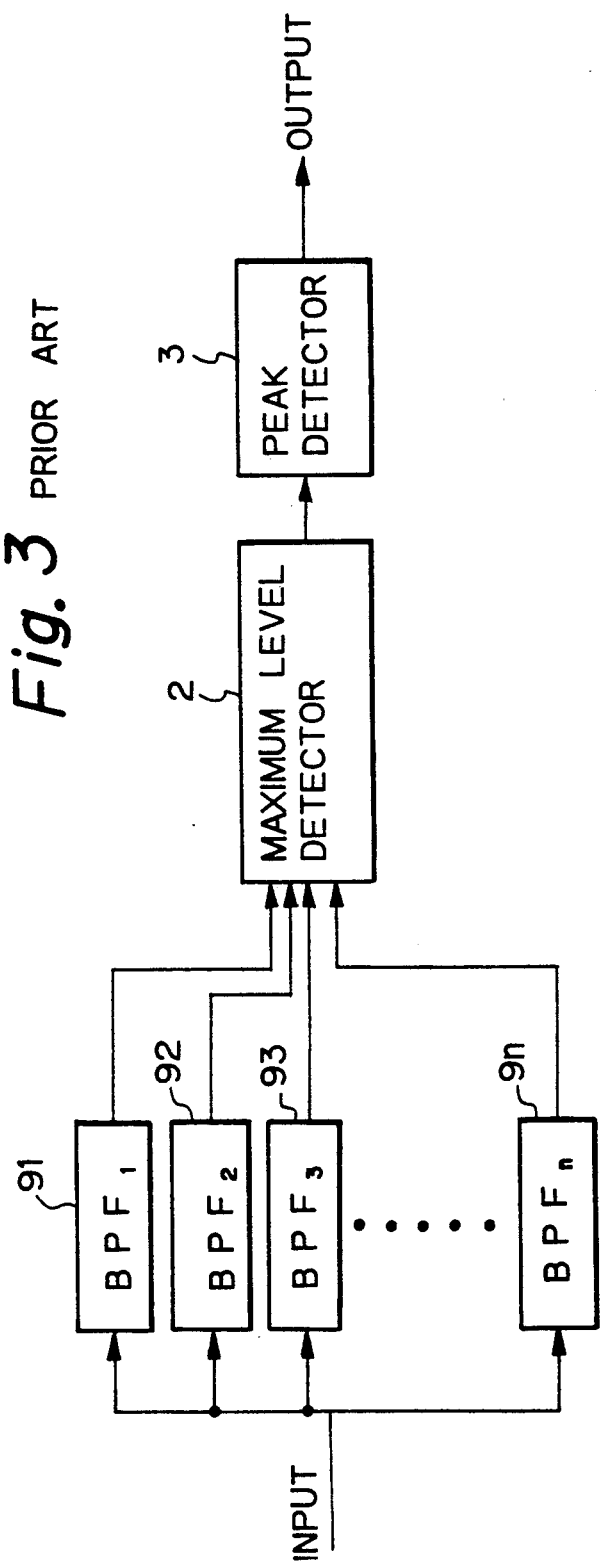

APPARATUS FOR DETECTION OF NON-MODULATED SIGNAL AND FREQUENCY ACQUISITION

BACKGROUND OF THE INVENTION

The present invention relates to an apparatus for detection of non-modulated signal and frequency acquisition, used in a radio communication system. That apparatus is used in an input stage of a radio receiver so that non-modulated signal at head of receive signal is detected for recognizing the presence of a receive signal and frequency acquisition for coherent detection in a receiver.

The present invention is used in a burst mode radio communication including a random access communication like ALOHA system, and/or a voice activation system.

FIG. 1 shows a signal format in those communication systems. In FIG. 1(a), the receive signal has a non-modulated signal (CW) at the head of the receive signal, and the modulated signal (MOD) follows that non-modulated signal. The modulated signal (MOD) is subject to coherent detection. The non-modulated signal (CW) is used for recognizing the presence of the receive signal, and the frequency acquisition in a receiver for coherent detection of the modulated signal (MOD). FIG. 1(b) is an example that the receive signal has two non-modulated signals (CW$_1$, CW$_2$) with a predetermined time interval. In case of FIG. 1(b), the detection of a receive signal is reliable since even when the first non-modulated signal (CW$_1$) is missed because of noise, the receive signal is recognized by using the second non-modulated signal (CW$_2$).

When a receive timing is unknown in those systems, the present invention detects a non-modulated signal at the head or the middle portion of the receive signal, and effects the frequency acquisition for coherent detection in a receiver.

Conventionally, a non-modulated signal detector, and a frequency acquisition apparatus are used separately.

FIG. 2 shows a prior non-modulated signal detector. In the figure, the numeral 9 is a bandpass filter, and 3 is a peak detector. The filter 9 is a narrow band pass filter having the center frequency equal to the frequency of the non-modulated signal which is subject to detection. When non-modulated signal appears in an input signal of the filter 9, an output level of the filter 9 is high. Then, the peak detector 3 detects the presence of a non-modulated signal by recognizing the peak output of the filter 9 on time axis, or detecting that the output level of the filter 9 exceeds a predetermined threshold level.

When a non-modulated signal to be detected has some frequency error, the filter 9 must have the pass band enough for receiving the signal with the allowable maximum frequency error. So, the larger the frequency error of a receive signal is, the larger the pass band of the filter is, and the worse the S/N of the output signal of the filter is. So, the probability of success of detecting a non-modulated signal is decreased when the frequency error is large.

FIG. 3 shows another prior art which solves the above problem, by having a plurality of bandpass filters 91 through 9n. In the figure, the numerals 91, 92, 93 ··· 9n are filters, 2 is a maximum level selector, and 3 is a peak detector. It is assumed that the filters have the different center frequency from one another so that pass band of a filter does not overlap with that of another filter. Even when the frequency error is large, one of the filters may receive the input signal. The maximum level selector 2 selects one of the filter outputs, so that the selected filter has the maximum output level. The peak detector 3 operates as is the case of FIG. 2.

An apparatus for frequency acquisition for coherent detection in a receiver must be used further in both the cases of FIG. 2 and FIG. 3, after non-modulated signal is detected, for the operation of a radio receiver. The apparatus for frequency acquisition may be a conventional phase synchronization device, or an apparatus based upon a DFT (digital Fourier Transform).

However, a prior non-modulated signal detector in FIG. 2 or FIG. 3 has the disadvantage that the probability of success of detection of non-modulated signal is worse when the frequency error is large in case of FIG. 2, and many filters must be used to complicate a hardware structure in case of FIG. 3.

Further, the delay time until the frequency acquisition is rather long, since the frequency acquisition operation starts after non-modulated signal is completely detected, in both cases of FIG. 2 and FIG. 3.

SUMMARY OF THE INVENTION

It is an object of the present invention to provide a new and improved apparatus for non-modulated signal detection and frequency acquisition, by overcoming the disadvantages and limitations of a prior art.

It is also an object of the present invention to provide an apparatus for detection of non-modulated signal and frequency acquisition which may detect non-modulated signal even when frequency error of a receive signal is large, It is also an object of the present invention to provide such an apparatus which effects both the detection of non-modulated signal, and the frequency acquisition, simultaneously, so that the time for the frequency acquisition is shortened.

The above and other objects are attained by an apparatus for detection of non-modulated signal and frequency acquisition comprising; first means for converting an input signal in analog form to digital form; second means for providing frequency spectrum of the latest N samples through Fourier transform method every time an output is provided by said first means; third means for providing the maximum level of frequency component in output of said second means; fourth means for providing a peak timing signal when peak value of the output of said third means is obtained on time axis; fifth means for estimating frequency of a non-modulated signal by using frequency spectrum with said peak value; and sixth means for adjusting frequency of output of said first means by using said estimated frequency obtained in said fifth means.

BRIEF DESCRIPTION OF THE DRAWINGS

The foregoing and other objects, features, and attendant advantages of the present invention will be appreciated as the same become better understood by means of the following description and accompanying drawings wherein;

FIG. 2 is a block diagram of a prior non-modulated signal detector, FIG. 3 is a block diagram of another prior non-modulated signal detector.

DESCRIPTION OF THE PREFERRED EMBODIMENTS

Figure 4:
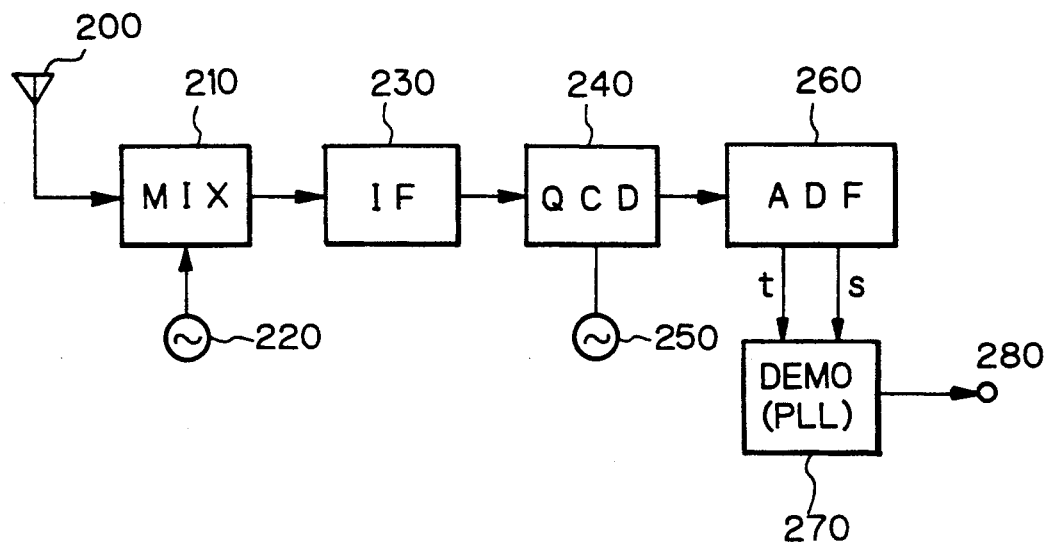
FIG. 4 is a block diagram of a radio receiver according to the present invention.

FIG. 4 shows a block diagram of typical radio receiver according to the present invention. In the figure, a radio signal is received by an antenna 200 which is coupled with a frequency mixer 210 for frequency conversion by using a local oscillator 220. An amplifier at high frequency stage may be inserted between the antenna 200 and the frequency mixer 210. An output of the frequency mixer 210 is intermediate frequency, which is amplified by an intermediate amplifier 230. An output of the intermediate amplifier 230 is subject to quasi coherent detection 240, which carries out the coherent detection for a receive signal by using a local frequency 250 which is close to receive frequency. As the local frequency 250 is not exactly the same as the receive frequency, the coherent detection in the detector 240 is incomplete, and is called quasi coherent detection.

A baseband signal of the output of the quasi coherent detector 240 is applied to an apparatus for detection of non-modulated signal and frequency acquisition 260 which is the feature of the present invention. The apparatus 260 provides the receive timing (t) of the receive signal, and frequency adjusted receive signal (S) which is subject to coherent detection. Those outputs are applied to a demodulator 270, which carries out coherent detection for said frequency adjusted receive signal. The demodulator may have a PLL (phase lock loop) for coherent detection. The demodulated signal in the demodulator 270 is output to the output terminal 280.

Now, the apparatus for detection of non-modulated signal and frequency acquisition 260 is described in detail. It is assumed in the following explanation that an input signal is orthogonal complex signal, which is in digital form through sampling with a predetermined period.

Figure 5:
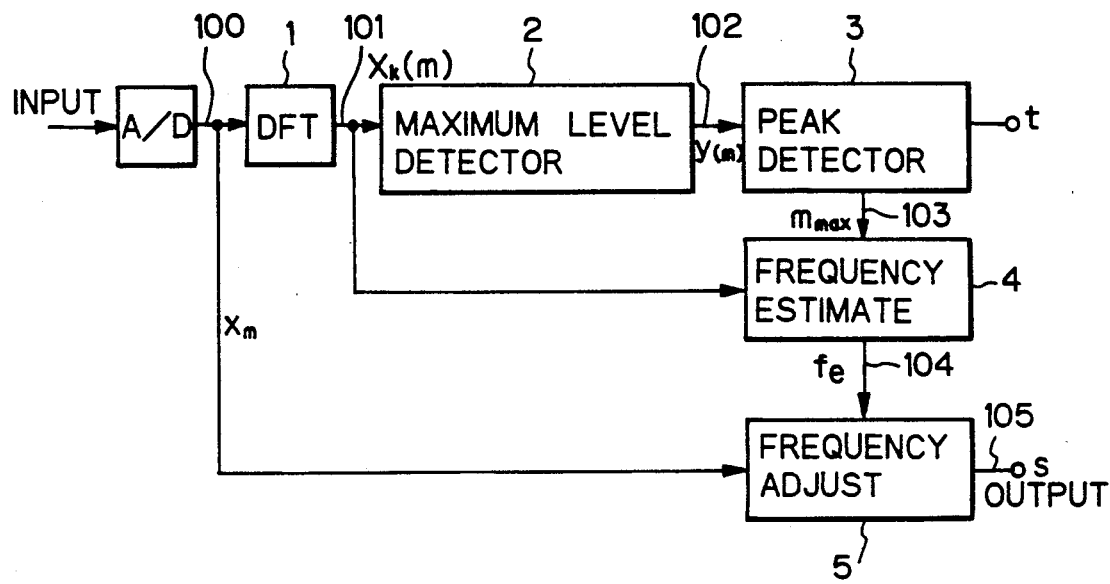
FIG. 5 is a block diagram of an apparatus for detection on non-modulated signal and frequency acquisition.

FIG. 5 shows a block diagram of the apparatus for the detection of non-modulated signal and frequency acquisition according to the present invention. In the figure, the symbol A/D shows an analog-to digital converter for converting an input signal in analog form to digital form with a predetermined sampling period, the numeral 1 is a DFT (Digital Fourier Transform) calculator, 2 is the maximum level selector for selecting a frequency component having the maximum level among the frequency spectrum in each DFT calculation, 3 is a peak level detector for detecting peak level of the selected maximum level on time axis, 4 is a frequency estimator, and 5 is a frequency adjuster.

The numeral 100 shows a sampled input signal x(m), 101 shows a frequency spectrum $X_k(m)$ which is the output of the DFT calculator, 102 is an output $y_m$ of the maximum level detector, 103 is an output of the peak detector, 104 is an estimated frequency provided by the frequency estimator 4, and 105 is an adjusted sampled signals x'(m) adjusted by the frequency adjuster 5.

The DFT calculator 1 calculates the DFT of the N number of samples which have been received, upon receipt of every sample, and provides the output in the form of the frequency spectrum. When an m'th input sample of an input signal 100 is designated as x(m), the frequency spectrum $X_k(m)$ 101 calculated as follows.

$$X_k(m) = \sum_{i=0}^{N-1} x(m - (N - 1) + i) \cdot W^{ik}, \quad (1)$$

$$(K_{min} \leq K \leq K_{max})$$

where $W = \exp(-j2\pi/N)$

The value K relates to the frequency of the frequency spectrum, and the minimum value $K_{min}$ and the maximum value $K_{max}$ of K are determined considering the possible frequency error. The number N of the samples in the DFT calculation is determined considering the length of the non-modulated signal in the input signal. For instance, when the length of the non-modulated signal is equal to n number of sample periods, N is determined to be n, so that when all the N samples are a non-modulated signal, the power of the non-modulated signal obtained by the DFT calculation is large as compared with that in the case of N≠n, and therefore, the probability of success of detecting non-modulated signal may be high. On the other hand, if we wish to detect a non-modulated signal quickly, N is determined to be smaller than n, so that the non-modulated signal is detected when N number of samples in the n number of signals are received.

The maximum level selector 2 selects the frequency component which has the maximum power among the frequency spectrum $X_k(m)$, ($K_{min} \leq K \leq K_{max}$). The output y(m) of the maximum level selector 2 is expressed as follows.

$$y(m) = \max |X_k(m)|^2 \quad (2)$$

$$K_{min} \leq K \leq K_{max}$$

It should be noted that if non-modulated signal exists in an input signal, the spectrum relating to that non-modulated signal is high.

The peak level detector 3 measures the level of y(m) obtained in the maximum level selector, and provides the value m which y(m) is at the peak. In other words, when the level y(m) increases with the value m, the peak level is not detected. When the level y(m) decreases, the peak level is determined to be y(m) just before the first decreased level.

Alternatively, the peak level detector 3 determines the value m so that $y(m) > V_y$ is satisfied, where $V_y$ is a predetermined threshold level. The peak level detector 3 provides the value $m_{max}$, which provides the peak level y(m), and is obtained in one of said manners, together with the pulse signal (t) showing the detection of non-modulated signal.

The frequency estimator 4 estimates the frequency $f_e$ of the non-modulated signal, by using the frequency spectrum $x_k(m_{max})$ ($K_{min} \leq K \leq K_{max}$) when the y(m)

has the peak value. The estimation is carried out by taking the frequency relating to the component $X_{k0}(m_{max})$ which has the maximum power.

Alternatively, the estimated frequency $f_e$ is obtained through interpolation calculation by the following equation, by using $X_{k0}(m_{max})$ and its adjacent spectrum component $X_{k1}(m_{max})$ (k1=k0−1, or k1=k0+1), and the frequencies $f_0$ and $f_1$ relating to $X_{k0}(m_{max})$ and $X_{k1}(m_{max})$, respectively. The value k1 is selected from one of k0−1 and k0+1 so that $X_{k1}(m_{max})$ has the higher value. In other words, when $X_{k0-1}(m_{max})$ is equal to or higher than $X_{k0+1}(m_{max})$, k1=k0−1 is selected.

$$f_e = f_0 + (f_1 - f_0) \cdot |X_{k1}(m_{max})| / (|X_{k0}(m_{max})| + |X_{k1}(m_{max})|) \quad (3)$$

Similarly, the phase estimation of the non-modulated signal may be carried out by using the spectrum components $X_{k0}(m_{max})$, and $X_{k1}(m_{max})$.

The estimated frequency $f_e$ thus obtained is provided at the output of the frequency estimator 4.

The frequency adjuster 5 adjusts the frequency of the input signal x(m) according to the following equation, and provides the adjusted signal x'(m) at the output 105.

$$x'(m) = x(m) \cdot \exp(-j2\pi f_e + \theta_e) \quad (4)$$

If the frequency estimator 4 provides the phase estimation, the estimated phase $\theta_e$ is used in the equation (4), althernatively, if the frequency estimator 4 does not provide the phase estimation, the value $\theta_e$ in the equation (4) may be arbitrary.

The level x(m) at the output of the A/D converter would be at the constant level for non-modulated signal, if the coherent detection in the quasi coherent detector 240 in FIG. 4 is complete and the frquency of the local oscillator 250 is exactly the same as that of the receive frequency (intermediate frequency). However, as the quasi coherent detection is usually incomplete, the frequency adjustment is carried out according to the equation (4) so that the non-modulated signal has the constant level.

The frequency adjustment is carried out not only for the non-modulated signal, but also for the modulated signal which follows the non-modulated signal. The adjusted output x'(m) of the frequency adjuster 5 is provided as the signal output (S), which is subject to coherent detection in a demodulator 270. The demodulator 270 operates conventionally by using a phase lock loop (PLL) for coherent detection, and clock regeneration, et al.

Figure 6:
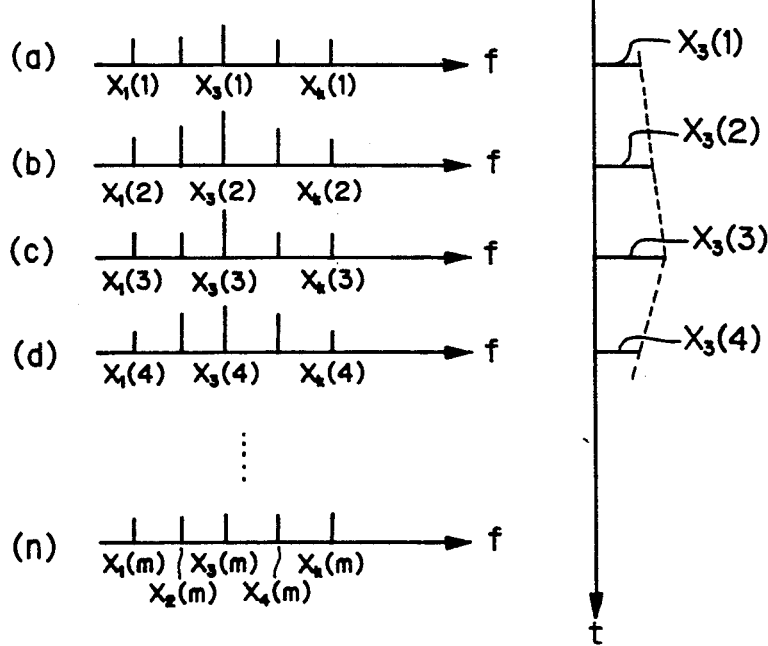
FIG. 6 shows frequency components for explaining operation of FIG. 5.

FIG. 6 shows the operational waveforms of FIG. 5. The DFT calculator 1 in FIG. 5 provides the frequency spectrum (a), (b), (c), (d), $\cdots$,(n), relating to the sampling timing 1, 2, 3, 4, $\cdots$,n, respectively. At the timing (1), as the frequency component $X_3(1)$ is the maximum in the frequency spectrum, the maximum level selector 2 provides $X_3(1)$. Similarly, the maximum level selector 2 provides $X_3(2)$, $X_3(3)$, $X_3(4)$ as the maximum frequency component at the sampling timing 2, 3 and 4.

The peak detector 4 measures the level of those maximum levels of the frequency component. In the example, $X_3(4)$ is lower than $X_3(3)$, therefore, it is determined that $X_3(3)$ is at the peak level. The timing output (t) is provided when the peak value $X_3(3)$ is determined.

The frequency $f_e$ is estimated through interpolation calculation of the frequencies relating to k=3 and k=2, or k=3 and k=4, according to the equation (3).

The frequency adjuster 5 adjusts the level of the samples $x_m$ of the output of the A/D converter, by using the estimated frequency $f_e$ according to the equation (4). The adjusted sample $x'_m$ is provided as the output signal S, which is subject to coherent detection.

As described, the detection of non-modulated signal and the frequency acquisition are carried out.

The modification of the above apparatus is possible as follows.

(a) The DFT calculation in the DFT calculator 1 may be carried out by using the FFT (Fast Fourier Transform), or the sliding DFT.

The FFT (Fast Fourier Transform) performs the DFT calculation as follows.

An input signal having N samples are expressed by the N dimension vector $U_N$;

$$U_N = (u_0, u_1, \cdots, u_{N-1})$$

And, the frequency spectrum obtained by the DFT for said $U_N$ is also expressed by the N dimension vector $V_N$;

$$V_N = (v_0, v_1, \cdots, v_{N-1})$$

The value N is supposed to be $N=2^a$ (a is an integer). When the FFT is expressed by $V_N = FFT(U_N)$, it is expanded as follows.

$$V_N = \text{joint}(\text{LOWER}(U_{N/2,0}, U_{N/2,1}), \text{UPPER}(U_{N/2,0}, U_{N/2,1}))$$

$$\text{LOWER}(U_{N/2,0}, U_{N/2,1}) = FFT(U_{N/2,0}) + FFT(U_{N/2,1}) \begin{pmatrix} W_0^N & & & 0 \\ & W_1^N & & \\ & & \cdot & \\ & & \cdot & \\ 0 & & & W_0^{2/N-1} \end{pmatrix}$$

$$\text{LOWER}(U_{N/2,0}, U_{N/2,1}) = FFT(U_{N/2,0}) + FFT(U_{N/2,1}) \begin{pmatrix} W_N^{N/2} & & & 0 \\ & W_N^{N/2+1} & & \\ & & \cdot & \\ & & \cdot & \\ 0 & & & W_N^{N+1} \end{pmatrix}$$

$$U_{N/2,0} = (u_0, u_2, u_4, \ldots, u_{N-2})$$
$$U_{N/2,1} = (u_1, u_3, u_5, \ldots, u_{N-1})$$

The JOINT is defined to be a single vector obtained by combining two vectors as follows.

$$\text{JOINT}((a_0, a_1, \cdots, a_n), (b_0, b_1, \cdots, b_m)) = (a_0, a_1, \cdots, a_n, b_0, b_1, \cdots b_m)$$

Therefore, the FFT for N samples is calculated by using the FFT's for N/2 samples. By repeating that, the FFT for N samples is calculated by using the FFT's for a single sample. The FFT for a single sample is FFT(u)=u.

The DFT in the equation (1) is calculated by using FFT, where $$u_i = x(m - (N - 1) + i)$$
$$v_k = x_k(m), \quad (0 \leq 1k \leq N/2 - 1)$$
$$x_{k-N}(m), \quad (N/2 \leq k \leq N - 1)$$

The sliding DFT is a method for calculating the DFT of the equation (1) as follows.

When the DFT until m'th sample of the N samples signal is expressed by the equation (1), the DFT output $X_k(m-1)$ until (m-1)'th sample is expressed;

$$X_k(m - 1) = \sum_{i=0}^{N-1} x(m - 1 - (N - 1) + i) \cdot W^{ik}, \quad (5)$$

$$(k_{min} \leq k \leq k_{max})$$

The equation (6) is obtained by the equations (1) and (5).

$$X_k(m) = W^{-k}[X_k(m-1) + x(m) - x(m-N)] \quad (6)$$

The sliding DFT calculates the output of the DFT for every sample by using the above equation (6) repetitively. The calculation amount is considerably reduced by using the sliding DFT as compared with the direct calculation of the equation (1).

(b) The DFT calculator 1 may obtaine the frequency spectrum with narrower frequency spacing than that of a conventional DFT, by using an extended DFT manner.

The following extension is considered for a DFT. The extended DFT output $X'_k(m)$ is defined by;

$$X'_k(m) = \sum_{i=0}^{N-1} x(m - (N - 1) + i) \cdot W^{ik}, \quad (7)$$

$$(k_{min} \leq k \leq k_{max})$$

The extended DFT provides the frequency spectrum with the frequency interval of 1/K of that of an ordinary DFT method.

The extended DFT may be used with the combination of an FFT and/or a sliding DFT.

As mentioned above, the present invention may follow any frequency error by selecting the value k of the range of the frequency spectrum in the equation (1) or (7) properly. As the power of the maximum spectrum component in an DFT output relating to a non-modulated signal is independent from the frequency error, the probability of success of detecting a non-modulated signal is quite high.

Further, as the spectrum $X_k(m_{max})$ for the frequency acquisition is obtained in the DFT calculator 1 before the non-modulated signal is detected, the process for the frequency acquisition is only to set the frequency (and phase) estimate calculated in the frequency estimator 4 to the frequency adjuster 5. Therefore, the delay time after the detection of a non-modulated signal to establish the frequency acquisition is very short.

When the sliding DFT is used for calculating a DFT, the calculation amount for each sample is considerably reduced.

Embodiment 2

Figure 1:
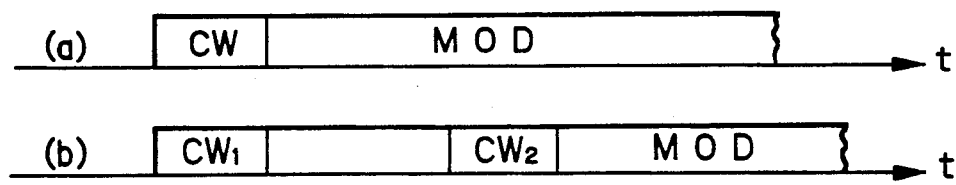
FIG. 1 shows examples of signal format of a receive signal used in the present invention.
Figure 7:
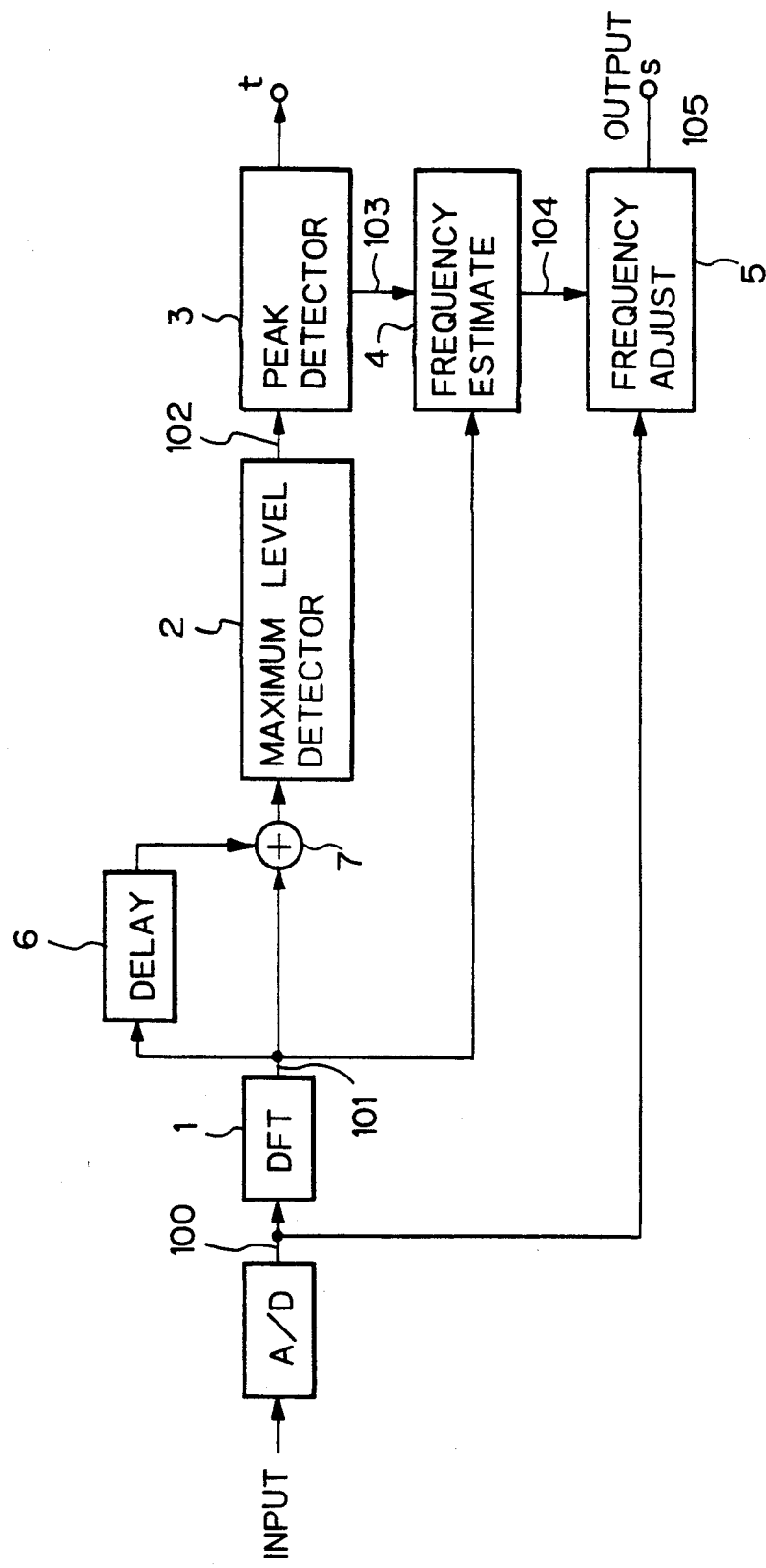
FIG. 7 is a block diagram of another embodiment of an apparatus for detection of non-modulated signal and frequency acquisition.

FIG. 7 shows another embodiment, which is used when at least two non-modulated signals in input signal, as shown in FIG. 1(b). In the figure, the numeral 1 is a DFT calculator, 2 is a maximum level selector, 3 is a peak detector, 4 is a frequency estimator, 5 is a frequency adjuster, 6 is a delay circuit, and 7 is an adder.

The frequency spectrum $X_k(m)$ obtained in the DFT calculator 1 is delayed by the M number of sample periods relating to the time spacing between two non-modulated signals, by the delay circuit 6.

The adder 7 adds the frequency spectrum $X_k(m)$ to the delayed frequency spectrum $X_k(m-M)$ for each relating component, and the sum $Y_k(m)$ of the power is shown below.

$$Y_k(m) = X_k(m)^2 + X_k(m-M)^2 \quad (8)$$

The maximum level detector 2 selects the component which has the maximum power in the spectrum of $Y_k(m)$ ($k_{min} < k < k_{max}$). So, the output y'(m) of the maximum level detector 2 is;

$$y'(m) = \max Y_k(m), \quad (k_{min} \leq k \leq k_{max}) \quad (9)$$

When a current input signal and an input signal prior to M samples are non-modulated signals, the frequency component relating to the frequency of non-modulated signal is the maximum.

The operation of the peak detector 3 is the same as that in the embodiment 1, except that y(m) is substituted with y'(m).

The frequency estimator 4 estimates the frequency of the non-modulated signal by using the frequency spectrum $X_k(m_{max})$, ($k_{min} \leq k \leq k_{max}$), as is the case of the embodiment 1. Alternatively, the frequency may by estimated by using the delayed frequency spectrum $X_k(m_{max}-M)$, ($k_{min} \leq k \leq k_{max}$), or the power sum of the spectrum $Y_k(m_{max})$, ($k_{min} \leq k \leq k_{max}$).

The operation of the frequency adjuster 5 is the same as that of the embodiment 1.

As described above, the detection of non-modulated signal, and the frequency acquisition when there are two non-modulated signals are established.

The use of an FFT, a sliding DFT, or an extended DFT is possible, as is the case of the embodiment 1.

When there are more than three non-modulated signals in a receive signal, it is possible to detect them by providing a plurality of delay circuits relating to an interval of non-modulated signals, and an adder 7 which adds outputs of all the delay circuits and an output of the DFT 1.

As mentioned above, when there are at least two non-modulated signals, the power sum of each components of the DFT output of N number of samples until now, and the DFT output of N number of samples prior to M samples is obtained according to the equation (8). So, when both N samples are non-modulated signals, the maximum value y'(m) of the power sum has the peak value. That peak value is higher than that of the embodiment 1, and therefore, the probability of success of detecting a non-modulated signal is higher than that of the embodiment 1.

Embodiment 3

Figure 8:
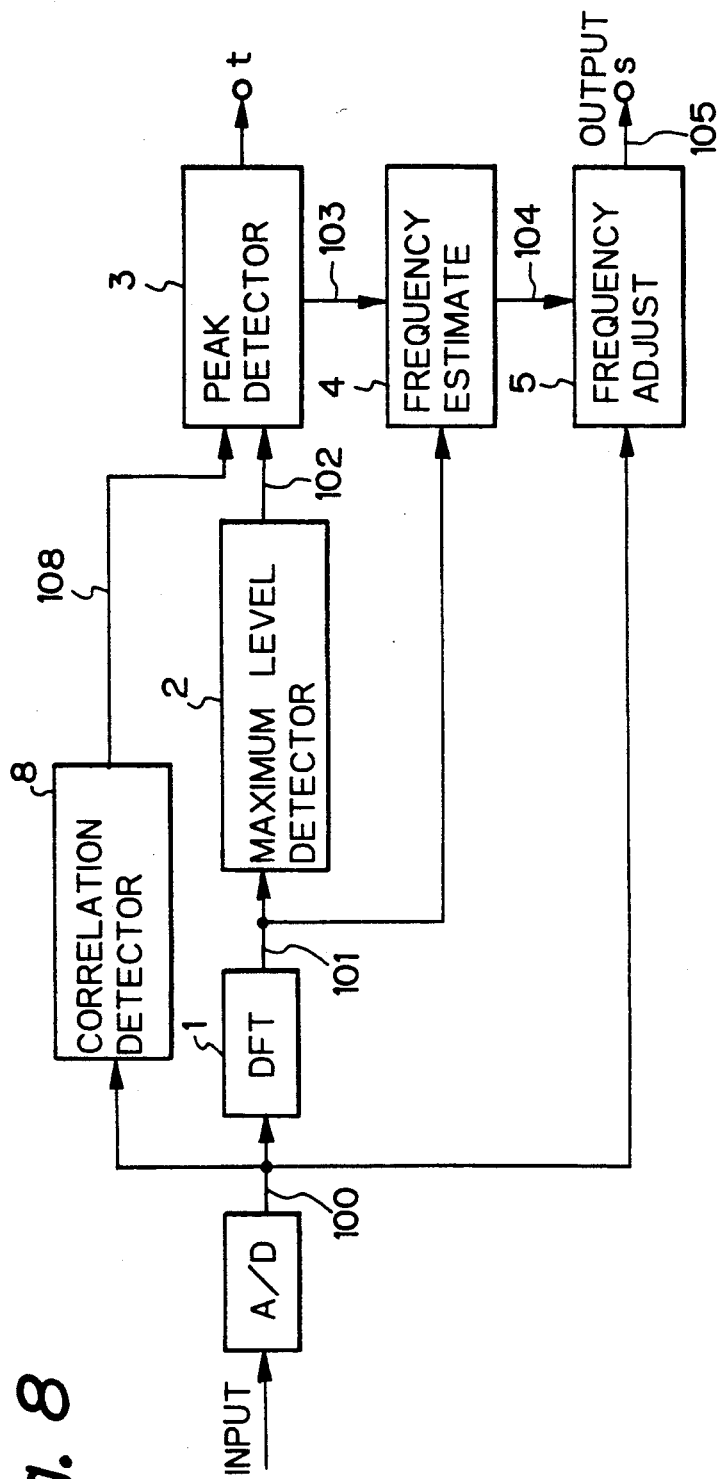
FIG. 8 is a block diagram of still another embodiment of an apparatus for detection of non-modulated signal and frequency acquisition.

Still another embodiment is shown in FIG. 8 which is applied to the case that two non-modulated signals exist as is the case of the second embodiment. In the figure, the numeral 1 is a DFT calculator, 2 is a maximum level selector, 3 is a peak detector, 4 is a frequency estimator, 5 is a frequency adjuster, and 8 is a correlation detector.

The DFT calculator 1 and the maximum level selector 2 operates similar to those of the embodiment 1 or the embodiment 2.

The correlation detector 8 provides an output signal z(m) which shows the probability that an input signal a non-modulated signal. When there are two non-modulated signals, those signals have the high correlation with each other, and therefore, the correlation detector 8 provides an output signal.

The peak detector 3 provides the value m, in which both the maximum level selector 2 and the correlation detector 8 provide the peak values y(m), and z(m), respectively. The value m providing the peak y(m) might not coincide with that which provides the peak z(m), according to the structure of the correlation detector 8. In that case, y(m) and z(m−L) are obtained so that they are in the peak values at the same time, where L is the difference of m providing the peak of y(m), and m' providing the peak of z(m'). Alternatively, the thresholds $V_y$ and $V_z$ are defined, and the value m satisfying $y(m) > V_y$ and $z(m-L) > V_z$ is determined.

Alternatively, y(m) and z(m−L) are combined by the function f(y,z) as follows, $$W(m) = f(y(m), z(m-L)) \quad (10)$$

and, the value m which makes W(m) peak or the value m which satisfies $W(m) > V_w$ for the threshold $V_w$ is determined.

When the value m thus obtained is used as $m_{max}$, the operation of the frequency estimator 4 and the frequency adjuster 5 is the same as that of the embodiment 1 or the embodiment 2.

Figure 9:
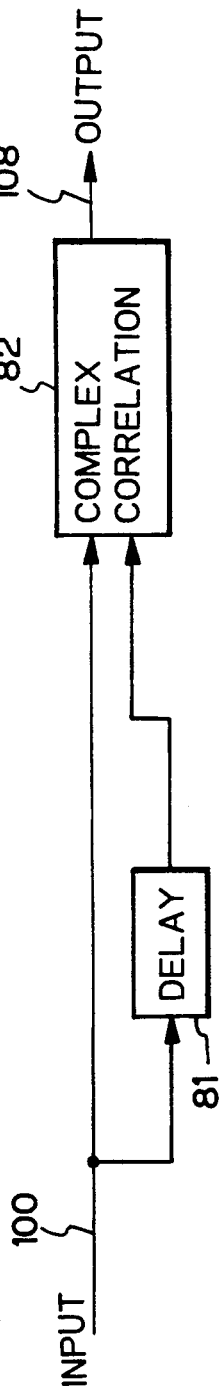
FIG. 9 is a block diagram of a correlation detector in FIG. 8, and FIGS. 10(A), 10(B) and 10(C) show some examples of a complex correlation detector in FIG. 9.

One embodiment of a correlation detector 8 is shown in FIG. 9, when two fixed patterns including a non-modulated signal appear at two locations of an input signal. In FIG. 9, the numeral 81 is a delay circuit for delaying a signal by a time equal to the interval of two non-modulated signals, and 82 is a complex correlator.

The delay circuit 81 delays an input signal by M sample periods relating to the interval of non-modulated signals.

The complex correlator 82 provides the complex correlation z(m) during J samples between an input signal and a delayed signal, as follows.

$$z(m) = \sum_{i=m-J+1}^{m} X(i) \cdot X^*(i-M) \quad (11)$$

where $X^*$ is a conjugate of X. The value z(m) takes a peak value when both of the X(m−M−J+1), ···, X(m−M), and X(m−J+1), ··· ,X(m) are non-modulated signals. So, the peak z(m) is used as the probability of the non-modulated signals.

Figure 10A:
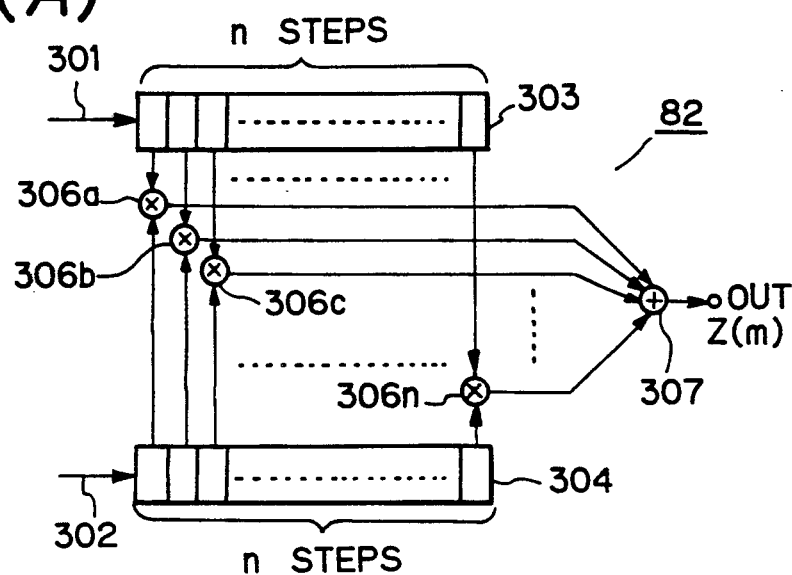
Figure 10B:
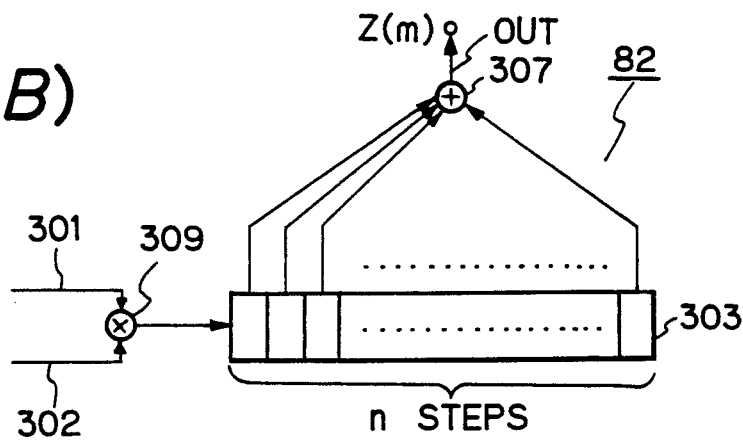
Figure 10C:
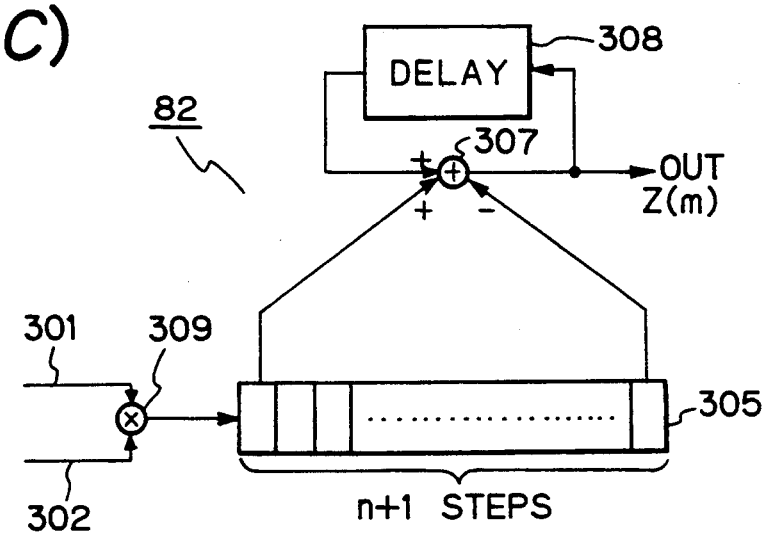

FIGS. 10(a), 10(b) and 10(c) show some embodiments of the correlation detector 82 in FIG. 9.

FIG. 10(a) is a first embodiment, in which 301 is a first input, 302 is a second input (an output of the delay circuit 81), 303 and 304 are a shift register which functions as a delay circuit, 306a through 306n are a multiplier for multiplying each output of each bit positions of two shift registers 303 and 304, and 307 is an adder for adding the outputs of all the multipliers.

It is supposed that an input signal at the input 302 is an conjugate of an output signal of the delay circuit 81.

The adder 307 provides the complex correlation of two input signals 301 and 302. The number n or the number of the bit positions of the shift registers 303 and 304 is determined so that n is equal to the number of samples in each DFT calculation. It is clear that the circuit of FIG. 10(a) provides the calculation of the equation 11.

FIG. 10(b) is the modification of FIG. 10(a), and the feature of FIG. 10(b) is that only one multiplier 309 is provided, and the multiplication for all the elements is carried out first, and then, the product is delayed in the shift register 303. An output of each bit position of the shift register 303 is added in the adder 307. The final output z(m) is the same as that of FIG. 10(a).

FIG. 10(c) is another modification. In this embodiment, a shift register 305 has n+1 bit positions. A delay circuit 308 delays a signal by one sample time. An output of the first bit and the last bit of the shift register 305, and an output of the delay circuit 308 are added in the adder 307. The correlation output z(m) is provided at the output of the adder 307.

In the embodiment of FIG. 8, the DFT calculation may be carried out by an FFT, a sliding DFT, or an extended DFT, as is the case of the first embodiment of FIG. 5.

FIG. 8 shows the embodiment that a correlation detector 8 is used in the embodiment of FIG. 5. Of course, it is possible to use a correlation detector 8 in the embodiment of FIG. 7.

The embodiment of FIG. 8 uses not only the maximum level of the frequency spectrum, but also the correlation which shows the probability of the non-modulated signal. So, an error of detecting a non-modulated signal is reduced.

The present invention detects non-modulated signal in an input signal irrespective of any frequency error of an input signal. If a sliding DFT is used for the calculation of DFT, the calculation amount for each sample is less, and the structure of a hardware is simplified. Since the delay time until the frequency acquisition after the detection of a non-modulated signal is short, a non-modulated signal is detected even when the duration of the non-modulated signal is short.

From the foregoing it will now be apparent that a new and improved apparatus for detection of non-modulated signal and frequency acquisition has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. An apparatus for detecting non-modulated signal and frequency acquisition comprising;
    first means for converting an input signal in analog form to digital form,
    second means for providing frequency spectrum of the latest N samples through Fourier transform method every time an output is provided by said first means,
    third means for providing the maximum level of frequency component in output of said second means,
    fourth means for providing a peak timing signal when peak value of the output of said third means is obtained on time axis, fifth means for estimating frequency of a non-modulated signal by using frequency spectrum at said peak timing, and sixth means for adjusting frequency of output of said first means by using said estimated frequency obtained in said fifth means.

2. An apparatus according to claim 1, wherein a delay circuit for delaying an output of said second means by an interval of non-modulated signals, and means for adding an output of said delay circuit and an output of said second means to provide power sum for each frequency component are provided between an output of said second means and an input of said third means.

3. An apparatus according to claim 1, wherein
a correlation detector which shows probability that an input signal is a non-modulated signal is coupled with an output of said first means,
said fourth means recognizes a peak level when both outputs of said third means and said correlation detector are at peak level, or when combined signal of those outputs is at peak level.

4. An apparatus according to claim 3, wherein said correlation detector comprises seventh means for delaying an input signal by an integer multiple of an interval of non-modulated signals, and eighth means for providing complex correlation of an output of said seventh means and an output of said first means.

5. An apparatus according to claim 1, wherein said second means is one selected from a discrete Fourier transform (DFT) circuit, an extended DFT circuit, a sliding DFT circuit, and a fast Fourier transform circuit (FFT).

6. An apparatus according to claim 1, wherein said fifth means estimates not only frequency but also phase of an input signal.

7. An apparatus according to claim 4, wherein said eighth means comprises a pair of shift registers for accepting signals for correlation calculation, a plurality of multipliers for providing product of each bit positions of said two shift registers, and an adder for adding each of said products to provide a correlation output.

8. An apparatus according to claim 4, wherein said eighth means comprises a single multiplier for providing product of two input signals, a single shift register which accepts said product, and an adder for adding signals at each bit positions of said shift register to provide a correlation signal.

9. An apparatus according to claim 4, wherein said eighth means comprises a single multiplier for providing product of two input signals, a single shift register which accepts said product, a delay circuit providing delay time equal to sampling interval, an adder for adding signals at a first bit position and a last bit position of said shift register, and an output of said delay circuit to provide a correlation signal, and an input of said delay circuit is coupled with an output of said adder.

* * * * *